United States Patent [19]
Sawano et al.

[11] Patent Number: 5,894,491
[45] Date of Patent: Apr. 13, 1999

[54] SEMICONDUCTOR LASER DEVICE OPERABLE WITH LOW NOISE EVEN IN HIGH AMBIENT TEMPERATURE

[75] Inventors: Hiroyuki Sawano; Yoshiyasu Ueno, both of Tokyo, Japan

[73] Assignee: NEC Corporation, Tokyo, Japan

[21] Appl. No.: 08/785,345

[22] Filed: Jan. 17, 1997

[30] Foreign Application Priority Data

Jan. 17, 1996 [JP] Japan ................. 8-005521

[51] Int. Cl.⁶ ................. H01S 3/19
[52] U.S. Cl. ................. 372/49; 372/46
[58] Field of Search ................. 372/45, 46, 43, 372/96, 50, 49

[56] References Cited

U.S. PATENT DOCUMENTS

| | | | |
|---|---|---|---|
| 4,731,792 | 3/1988 | Shimizu et al. | 372/49 |
| 4,914,668 | 4/1990 | Nagai et al. | 372/49 |
| 4,961,197 | 10/1990 | Tanaka et al. | 372/45 |
| 5,506,170 | 4/1996 | Yodoshi et al. | 437/129 |
| 5,581,570 | 12/1996 | Yoshida et al. | 372/46 |
| 5,608,752 | 3/1997 | Goto et al. | 372/45 |

OTHER PUBLICATIONS

InGaAlP Transverse Mode Stabilized Visible Laser Diodes Fabricated by MOCVD Selective Growth Masayuki Ishikawa et al. pp. 153–156 1986. No month.

A translation of the reference is cited on p. 2. pp. 989–990 1994. No month.

Primary Examiner—Rodney Bovernick
Assistant Examiner—Ellen Eunjoo Kang

[57] ABSTRACT

In a semiconductor laser device comprising a plurality of semiconductor layers laminated in a vertical direction on a substrate to form a laser resonator, the laser resonator comprises a saturable absorbing region. A spot size of a light waveguide profile in the vertical direction is greater than 0.4 μm. The laser resonator further comprises first and second reflecting films to provide a reflectivity greater than 50(%).

5 Claims, 9 Drawing Sheets

SEMICONDUCTOR LASER DEVICE OPERABLE WITH LOW NOISE EVEN IN HIGH AMBIENT TEMPERATURE

BACKGROUND OF THE INVENTION

This invention relates to a semiconductor laser device which is operable with low noise even in high ambient temperature.

Recently, a semiconductor laser device is widely used for a light source in the field of a optical disk unit and an optical communication system. In particular, it is required that the semiconductor laser device used for the optical disk unit has a low optical feedback noise on readout of data from an optical disk. On such a requirement, it is well known that a self-pulsation laser device generates laser light which has a low coherence characteristic and the low optical feedback noise. Under the circumstances, if the self-pulsation laser device is used for the light source of the optical disk unit, it is unnecessary to use a high frequency module for suppressing the optical feedback noise and is no need a countermeasure against electromagnetic radiation. As a result, it is possible to provide the optical disk unit with a reduced size and a reduced cost.

In the meantime, self-pulsation operation can be obtained by forming a saturable absorbing region within a laser resonator and by controlling a saturable absorbing quantity. Such a self-pulsation operation and a laser structure are disclosed in "(Extended Abstract of 18th Conference on Solid State Devices and Materials), page 153, a paper number of D-1-2, page 21 of Proceedings in 11-th semiconductor laser symposium". Furthermore, six examples of the self-pulsation laser are reported in Extended Abstracts (41st spring meeting, 1994), the Japan Society of Applied Physics and Related Societies. The report discloses a self-pulsation laser structure that a part of an active layer positioned at both sides of a ridge waveguide is utilized as the saturable absorbing region.

The above-mentioned semiconductor laser device has, however, the following disadvantage. Namely, a conventional semiconductor laser device stops the self-pulsation operation in high ambient temperature. On the other hand, it is anticipated that the light source of the optical disk unit is used in the ambient temperature of 60° C. at most. In this case, the above-mentioned semiconductor laser device is unsuitable for the light source of the optical disk unit which may be used in a high ambient temperature because the noise of the laser device increases.

SUMMARY OF THE INVENTION

It is therefore an object of this invention to provide a semiconductor laser device which is operable with low noise even in a high ambient temperature.

A semiconductor laser device according to this invention comprises a plurality of semiconductor layers laminated in a predetermined direction on a substrate to form a laser resonator. The laser resonator comprises a saturable absorbing region formed therein, a first facet defining a laser emitting surface, and a second facet opposite to the first facet.

According to an aspect of this invention, a spot size of a light waveguide profile in the predetermined direction is greater than 0.4 μm. The laser resonator further comprises first and second reflecting films which are coated on the first and the second facets to provide a reflectivity greater than 50(%).

DESCRIPTION OF THE PREFERRED EMBODIMENT

Figure 1:
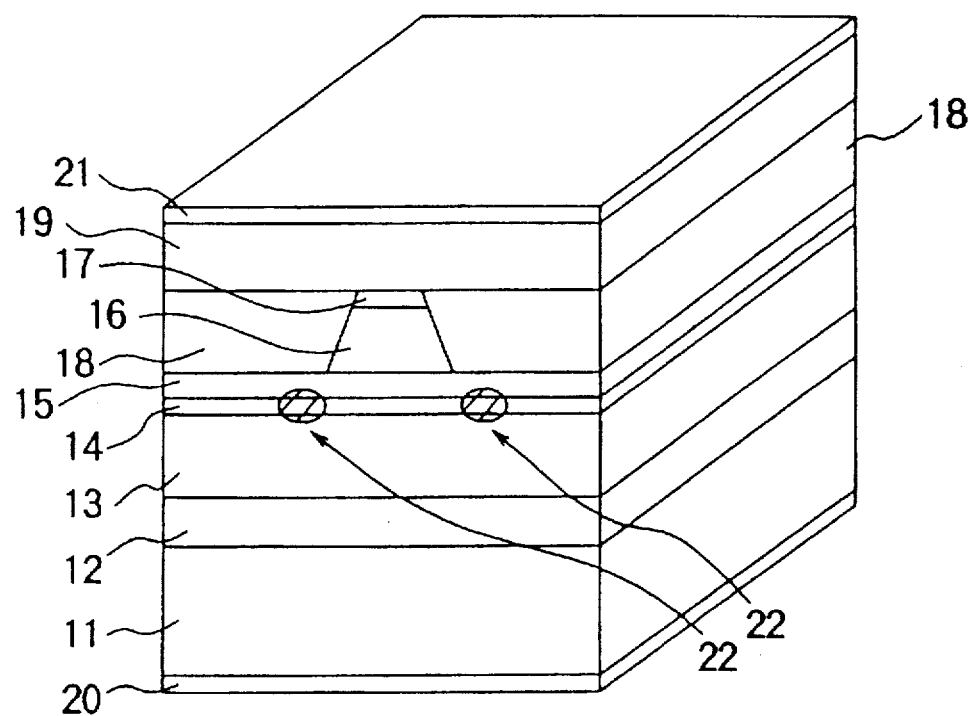
FIG. 1 shows an illustration for describing a structure of a conventional semiconductor laser device.
Figure 2:
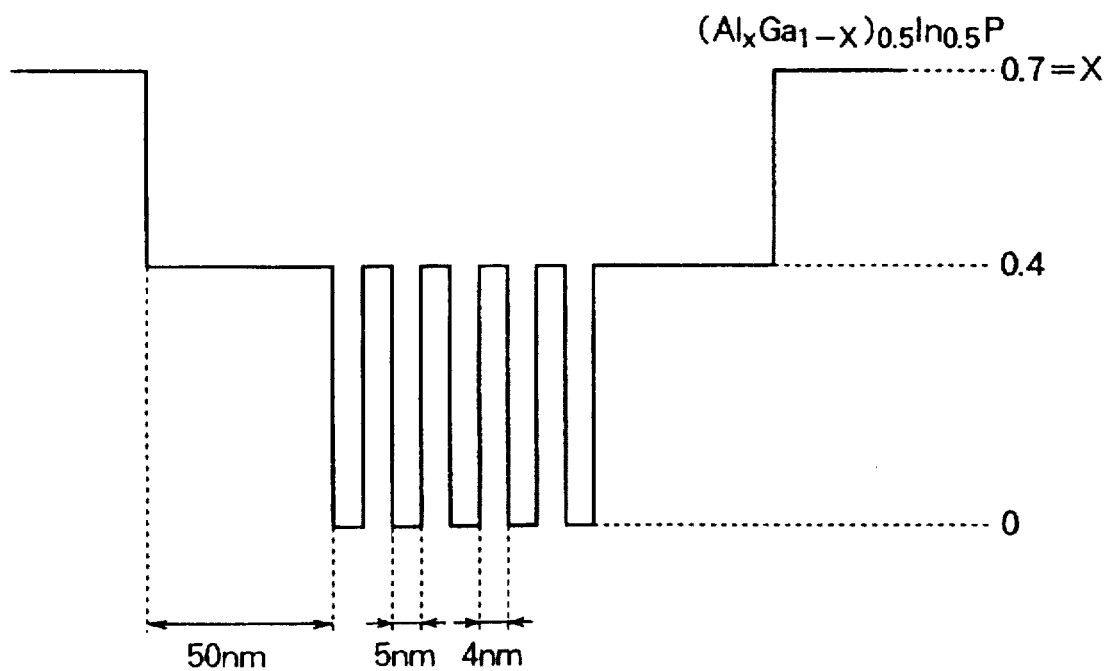
FIG. 2 shows an illustration for describing a composition of an active layer and cladding layers which are illustrated in FIG. 1.
Figure 3:
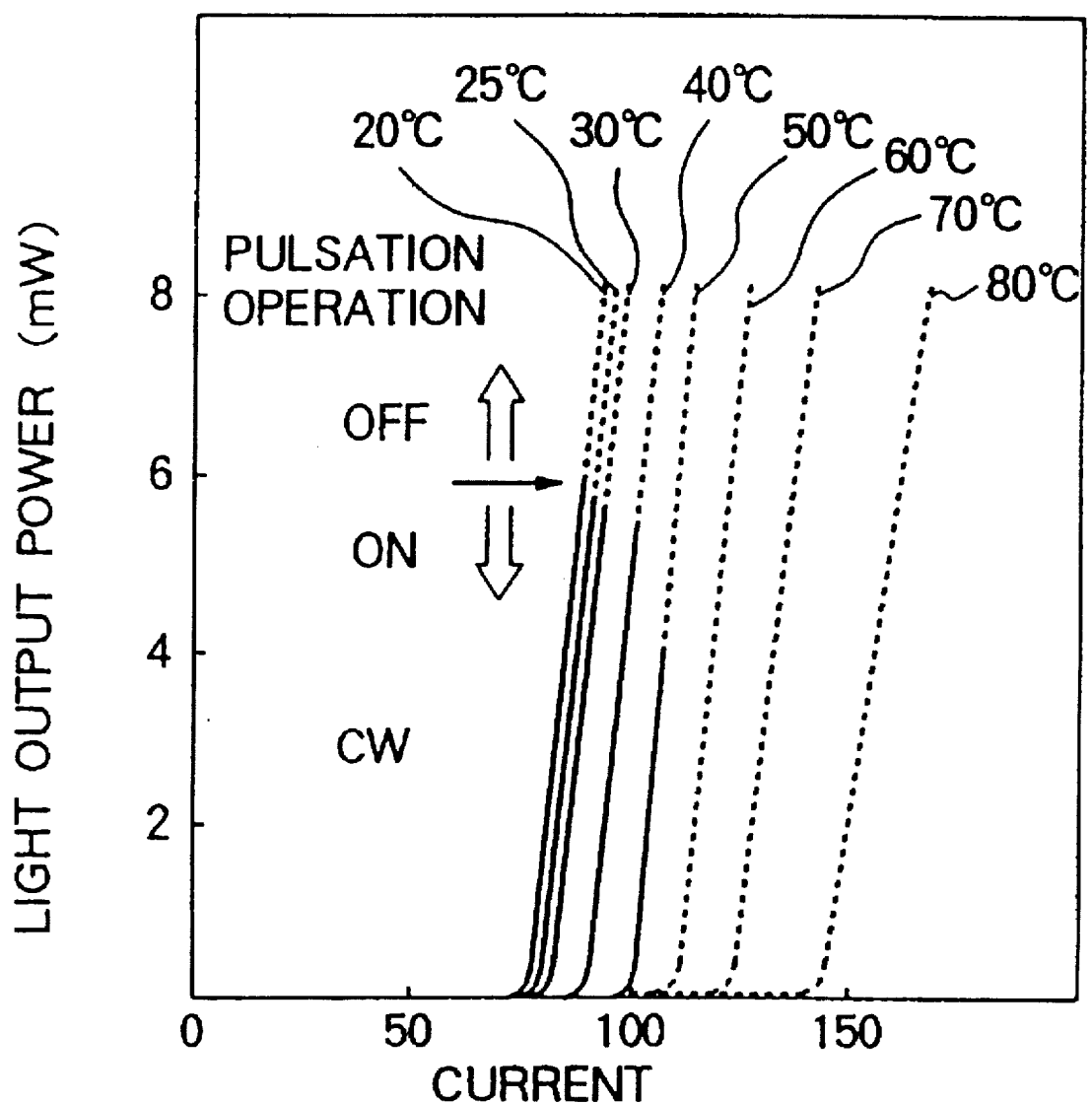
FIG. 3 shows a graphic illustration for describing temperature dependency of self-pulsation operation of the semiconductor laser device illustrated in FIG. 1.

Referring to FIGS. 1 to 3, description will be made with regard to a conventional semiconductor laser device in order to facilitate an better understanding of the present invention. The semiconductor laser device is the type of an AlGaInP red-light pulsation semiconductor laser device which has a ridge waveguide structure as a typical one of self-pulsation laser structures and which has saturable absorbing regions formed in an active layer at both sides of the ridge waveguide.

In FIG. 1, the semiconductor laser device has a laser resonator structure formed on an n-GaAs substrate 11. An n-GaAs buffer layer 12, an n-AlGaInP cladding layer 13, a GaInP/AlGaInP multiple quantum well active layer 14, and a p-AlGaInP cladding layer 15 are formed, in order, onto the substrate 11 in a vertical (lamination) direction. A stripe-shaped mesa structure is formed onto the cladding layer 15 and comprises a p-AlGaInP cladding layer 16 and a p-GaAs cap layer 17. A pair of current blocking layers 18 are formed onto the cladding layer 15 at both sides of the mesa structure. A p-GaAs cap layer 19 is formed on the mesa structure and the pair of current blocking layers 18. An n-electrode 20 is formed onto an under surface of the substrate 11 while a p-electrode 21 is formed onto the cap layer 19.

A pair of saturable absorbing regions 22 are formed in the multiple quantum well active layer 14 at both sides of the mesa structure. The mesa structure has a mesa width of 4 μm at a bottom thereof. A thickness of the cladding layer 15 is equal to 0.4 μm. Although not depicted in FIG. 1, the semiconductor laser device has front and rear facets defining laser emitting surfaces. Each of the front and the rear facets is coated by alumina coating films to provide a reflectivity equal to 30(%).

Referring to FIG. 2, the description will proceed to an aluminium composition of an AlGaInP crystal in a quantum well structure of the multiple quantum well active layer 14 and the cladding layers 13 and 15. A spot size is defined by a value that a thickness of the multiple quantum well active layer 14 is divided by a light confinement factor in the vertical direction. In this case, the spot size is equal to 0.29 μm.

The semiconductor laser device serves as a pulsation laser device because it comprises the saturable absorbing regions 22 having a suitable absorbing quantity. As a result, the semiconductor laser device is operable with a low noise.

Referring to FIG. 3, the description will be made with regard to a relation between a light output power and a current of the semiconductor laser device. If an ambient temperature of the semiconductor laser device increases, the semiconductor laser device stops a pulsation operation as illustrated by dotted lines in FIG. 3. In other words, a conventional semiconductor laser device has increased noise as the ambient temperature increases.

On the other hand, it is anticipated that a light source of a optical disk unit is used in the ambient temperature of 60° C. at most. In such an ambient temperature, if the above-mentioned semiconductor laser device is used for the light source of the optical disk unit, it is impossible to keep the pulsation operation.

Referring to FIGS. 4 to 8, the description will be made with regard to a semiconductor laser device according to a first embodiment of this invention. The semiconductor laser device has the same laser resonator structure as the semiconductor laser device mentioned in conjunction with FIG. 1. Accordingly, the semiconductor laser device comprises similar parts designated by like reference numerals in FIG. 1 except that the front facet of the semiconductor laser device is covered by multiple high reflectivity reflection films 31 and that the rear facet of the semiconductor laser device is covered by multiple high reflectivity reflection films 32. The multiple high reflecting reflection films 31 and 32 have a reflectivity greater than 50(%). A spot size of a light waveguide profile is greater than 0.4 μm.

By an MOVPE (Metalorganic Vapor Phase Epitaxy) method, the n-GaAs buffer layer 12, the n-AlGaInP cladding layer 13, the GaInP/AlGaInP multiple quantum well active layer 14, the p-AlGaInP cladding layer 15, a p-GaInP etching stopper layer, the p-AlGaInP cladding layer 16, a p-GaInP thin film layer, and the p-GaAs cap layer 17 are formed, in order, onto the n-GaAs substrate 11 in the vertical direction. For convenience, the p-GaInP etching stopper layer and the p-GaInP thin film layer are not shown in FIG. 5.

Figure 5:
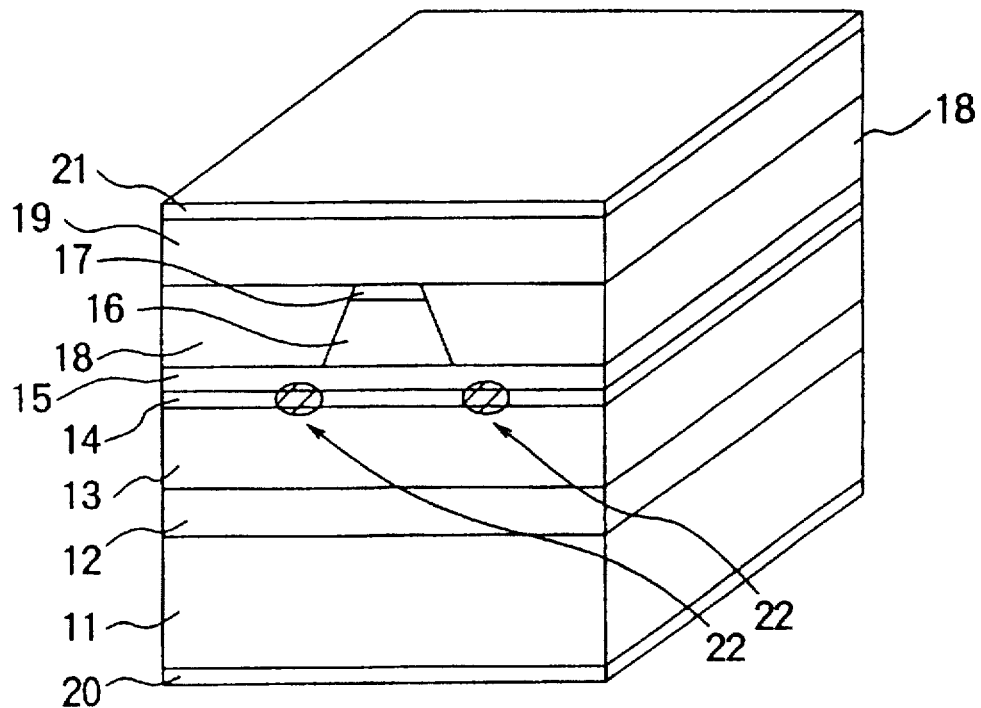
FIG. 5 shows an illustration for describing a layer structure of the semiconductor laser device illustrated in FIG. 4.

Next, the cladding layer 16 and the cap layer 17 are etched by photolithography and etching so as to form a stripe-shaped mesa structure. The mesa structure has a mesa width of 4 μm at a bottom thereof. By the use of the MOVPE method, a pair of the current blocking layers 18 are formed onto the cladding layer 15 at both sides of the mesa structure. The p-GaAs cap layer 19 is formed on the mesa structure and the pair of current blocking layers 18. The n-electrode 20 is formed onto an under surface of the substrate 11 while the p-electrode 21 is formed onto the cap layer 19. By cleavage, the front and the rear facets are formed as illustrated in FIG. 5. After this, the multiple high reflectivity reflection films 31 are formed onto the front facet of the semiconductor laser device by the use of amorphous silicon/alumina multiple films. Similarly, the multiple high reflectivity reflection films 32 are formed onto the rear facets the semiconductor laser device by the use of amorphous silicon/alumina multiple films. The multiple high reflectivity reflection films 31 have the reflectivity equal to 60(%) while the multiple high reflectivity reflection films 32 have the reflectivity equal to 95(%). In the example, a pair of saturable absorbing regions 22 are formed in the multiple quantum well active layer 14 at both sides of the mesa structure.

Figure 6:
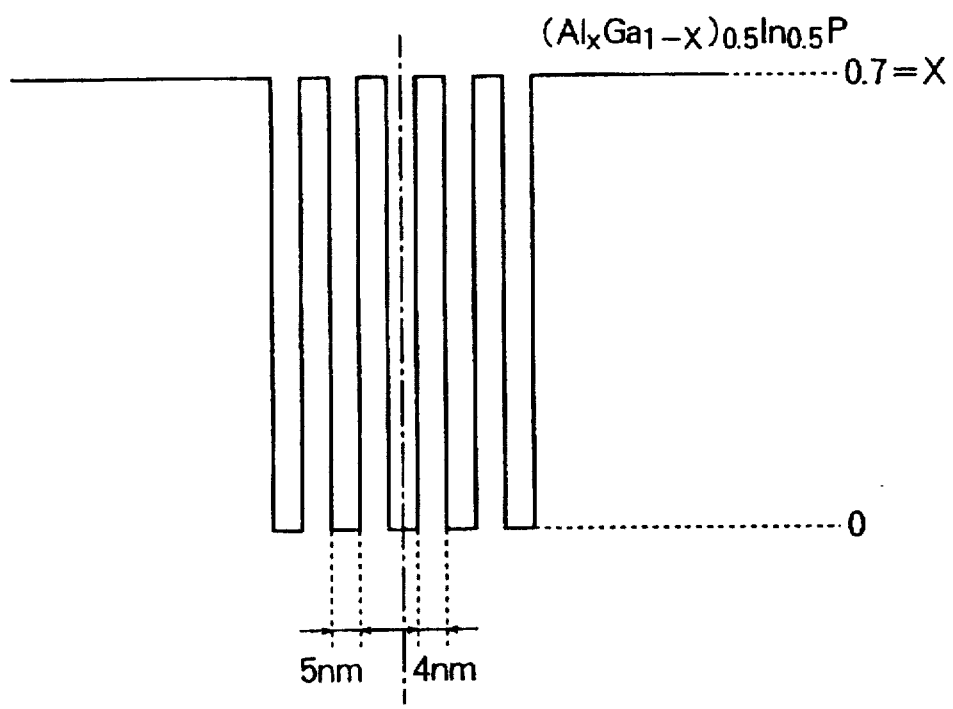
FIG. 6 shows an illustration for describing a composition of an active layer and cladding layers which are illustrated in FIG. 5.

In FIG. 6, the description will proceed to an aluminium composition of an AlGaInP crystal in a quantum well structure of the multiple quantum well active layer 14 and cladding layers 13 and 15. In the example, the quantum well structure has a symmetrical structure which is symmetrical with a chain line. Specifically, the quantum well structure has wells which are equal to five in number and which have a width equal to 5 nm. The semiconductor laser device has the spot size equal to 0.43 μm in the vertical direction. The semiconductor laser device serves as the pulsation laser device because it comprises the saturable absorbing regions 22 having a suitable absorbing quantity. As a result, the semiconductor laser device is operable with a low noise and further the pulsation operation is kept in the ambient temperature equal to 60° C.

Figure 7:
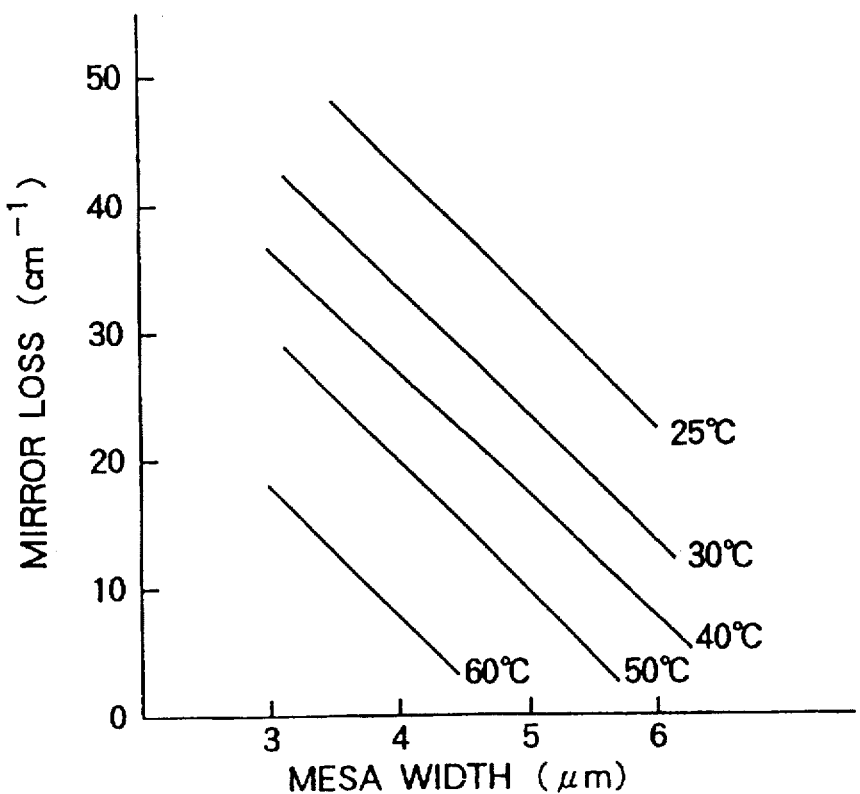
FIG. 7 shows a characteristic for describing a maximum avairable temperature for self-pulsation operation as a function of a mirror loss and a mesa width of a mesa structure, and ambient temperatures of the semiconductor laser device illustrated in FIG. 1.

Referring to FIG. 7, the description will be made with regard to the operation of the semiconductor laser device. In FIG. 7, a maximum avairable temperature for the pulsation operation is shown as a function of the mesa width and a mirror loss. The reflectivities of the multiple high reflectivity reflection films 31 and 32 and a length of the laser resonator are changed to vary the mirror loss. Particularly, the AlGaInP red-light emitting semiconductor laser device adopts a waveguide structure in which the active layer is not interrupted taking characteristic of the material thereof into consideration. Furthermore, from a view point of operating reliability for a long time, it is required that the waveguide structure has a width which is not smaller than 4 μm. In the example, the width of the waveguide structure corresponds to the width of the bottom of the mesa structure.

In the semiconductor laser device comprising the waveguide structure having the width which is not smaller than 4 μm, it is possible to keep the pulsation operation in the ambient temperature of 60° C. under the condition that a mirror loss is not greater than 10 $cm^{-1}$. In practice, the laser resonator has the length which is not greater than 700 μm. Such a value is a maximum value which has already been reported in the field of the red-light emitting semiconductor laser device. Taking the above into consideration, the above-mentioned pulsation operation is achieved under the condition that the front and the rear facets have the reflectivities which are not smaller than 50(%).

In general, if the facet of the laser resonator has a high reflectivity, it is hard to obtain a high light output power because of reduction of a maximum light output power due to catastrophic optical damage (COD). In order to obtain a stabilized light output power of 5 mW, it is necessary to have the COD level which is equal to at least twice through three times the light output level. Since the semiconductor laser device mentioned above has the spot size equal to 0.4 μm, it is possible to obtain the high light output power of 15 mW even if the semiconductor laser device comprises the facets surfaces having the high reflectivity which is not smaller than 50(%).

Figure 8:
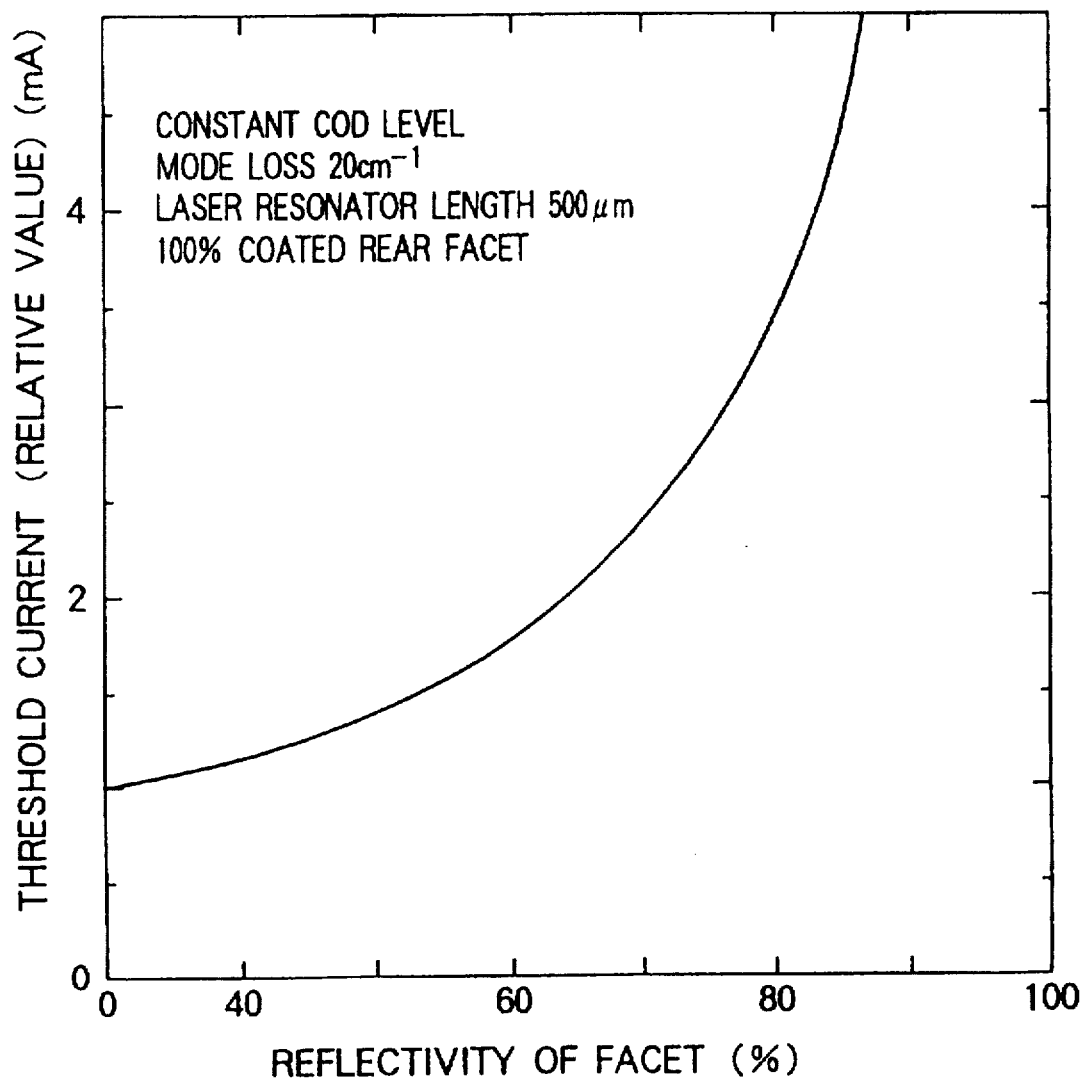
FIG. 8 shows a graphic illustration for describing a relation between a threshold current and reflectivity of a facet of the semiconductor laser device at a condition of a constant COD level illustrated in FIG. 5.

When the semiconductor laser device has an enlarged spot size and comprises the facets of the high reflectivity so as to make the COD level at a constant level, a threshold current value of oscillation increases as illustrated in FIG. 8. Although it is no report with regard to a combination the facets of the high reflectivity not smaller than 50(%) and the spot size not smaller than 0.4 μm, it is possible to increase the ambient temperature which is capable of keeping the pulsation operation by the combination mentioned above. This is because the reduction of the mirror loss directly contribute to the pulsation operation.

Figure 9:
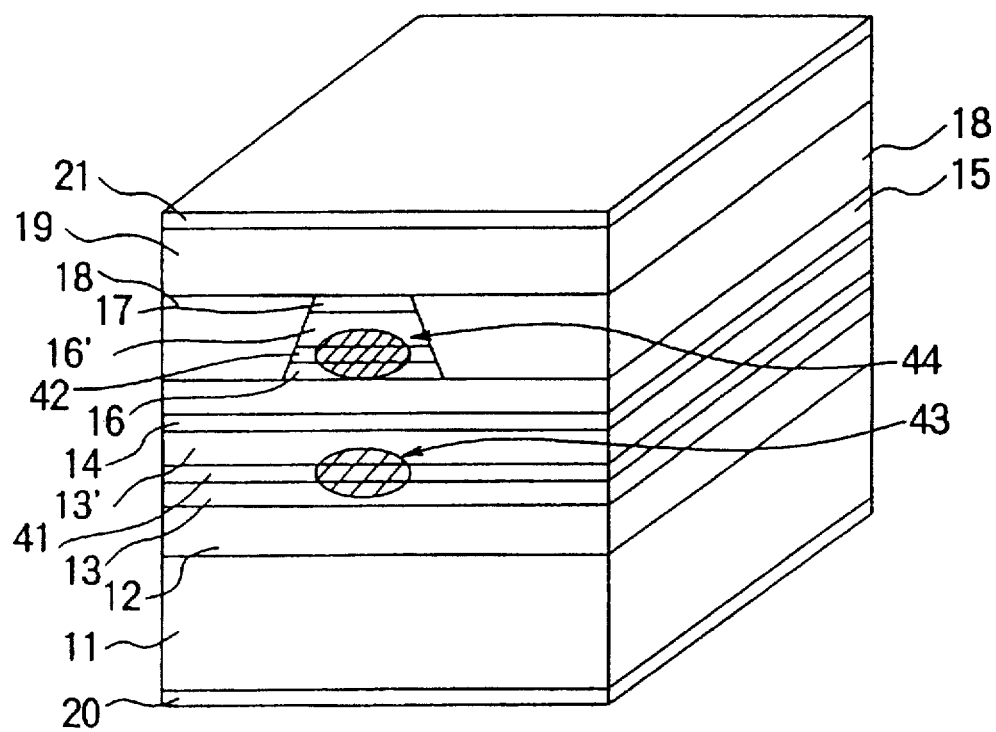
FIG. 9 shows an illustration for describing a layer structure of a semiconductor laser device according to a second embodiment of this invention.
Figure 10:
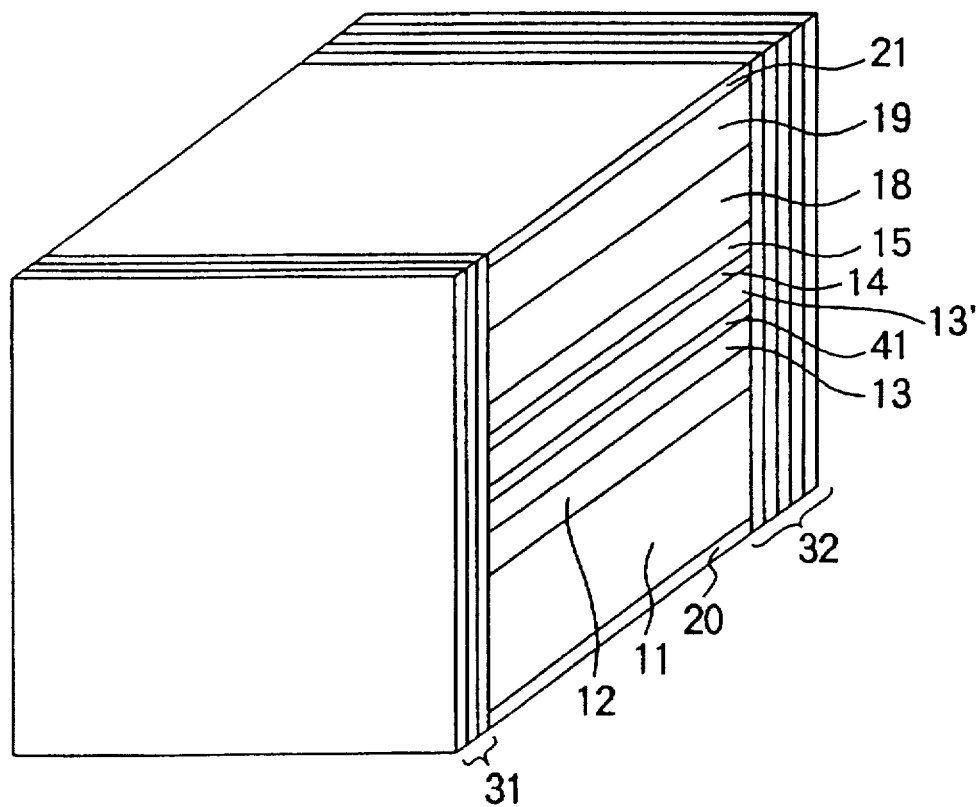
FIG. 10 shows an illustration for describing an outline of the semiconductor laser device illustrated in FIG. 9.
Figure 11:
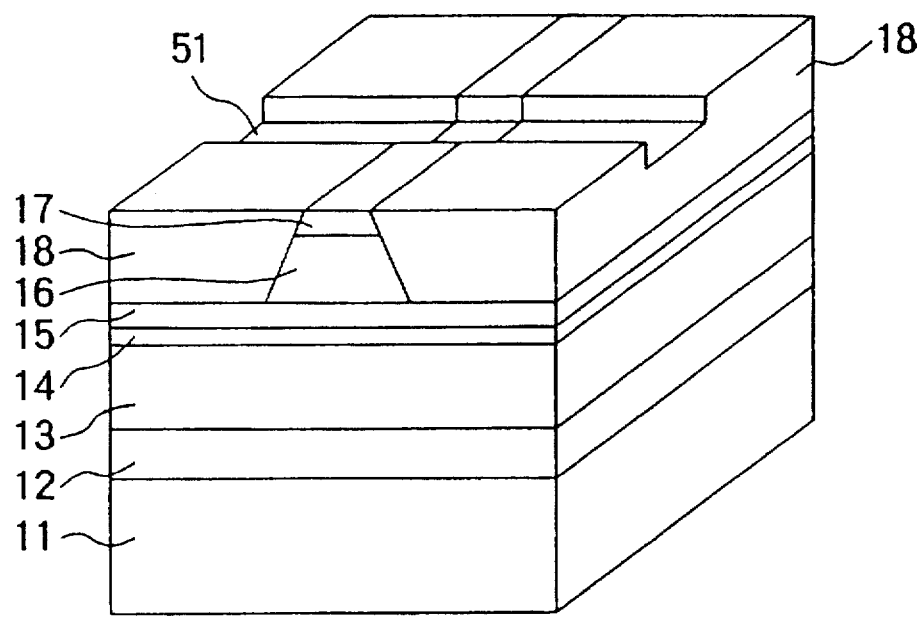
FIG. 11 shows an illustration for describing a fabrication process of a semiconductor laser device according to a third embodiment of this invention.
Figure 12:
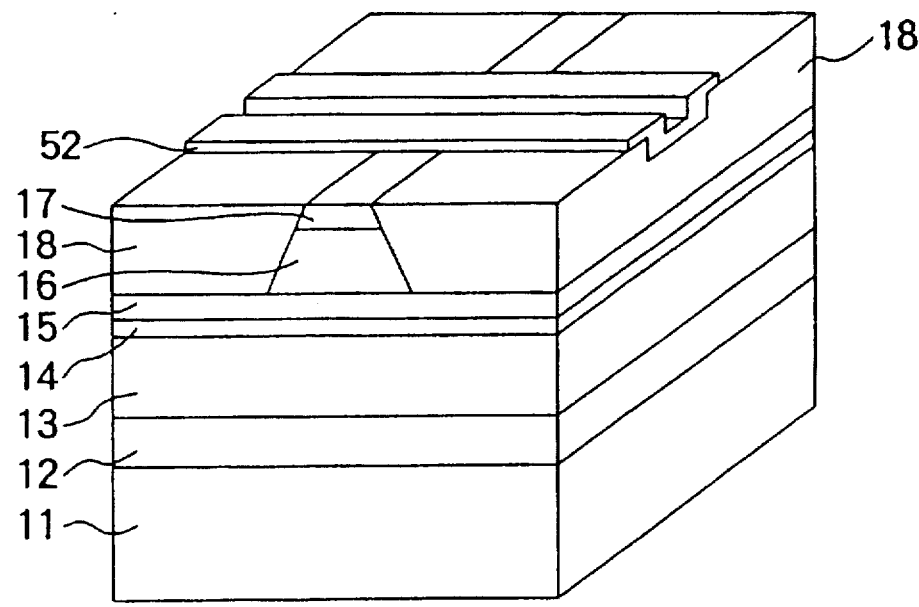
FIG. 12 shows an illustration for describing a fabrication process continued from the fabrication process illustrated in FIG. 11.
Figure 13:
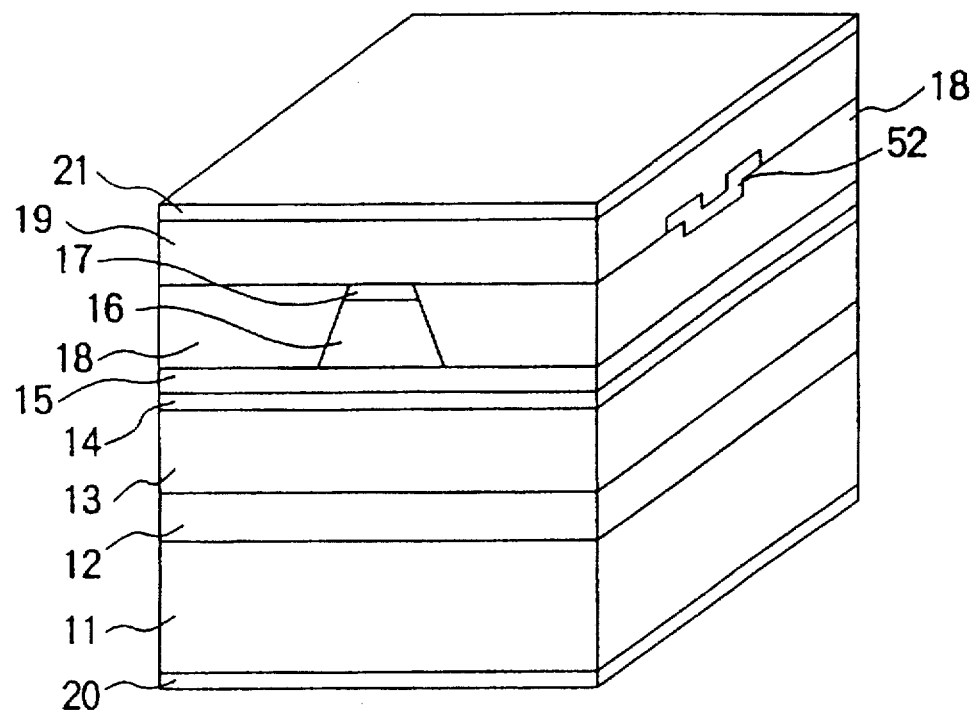
FIG. 13 shows an illustration for describing a structure of the semiconductor laser device obtained through the fabrication processes illustrated in FIGS. 11 and 12.
Figure 14:
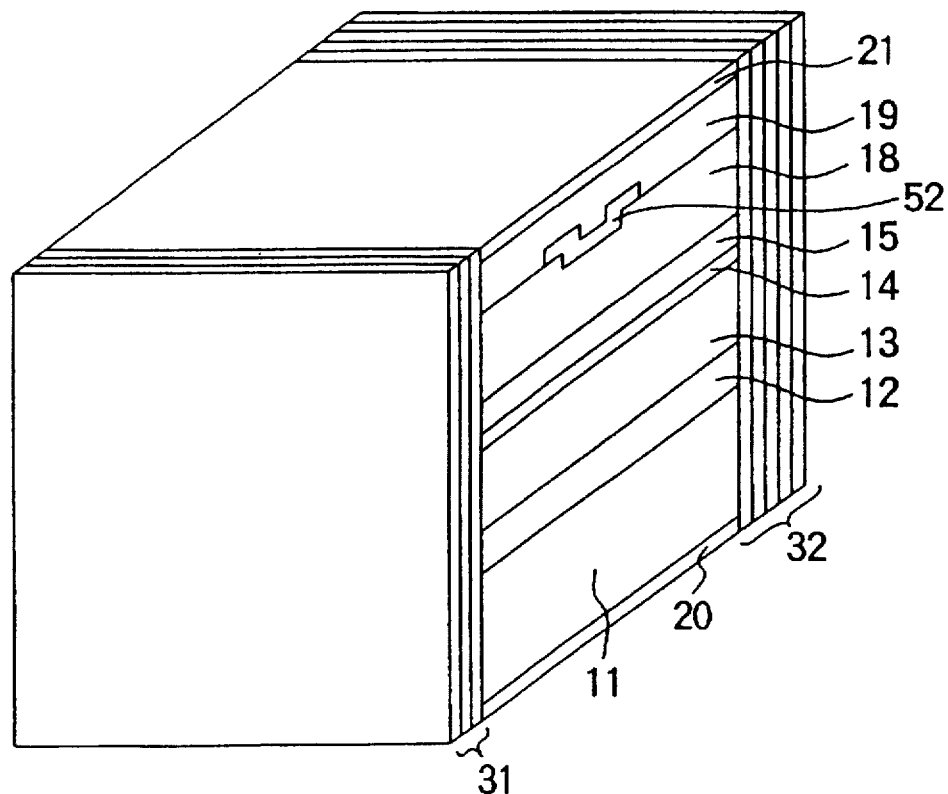
FIG. 14 shows an illustration for describing an outline of the semiconductor laser device illustrated in FIG. 13.
Figure 15:
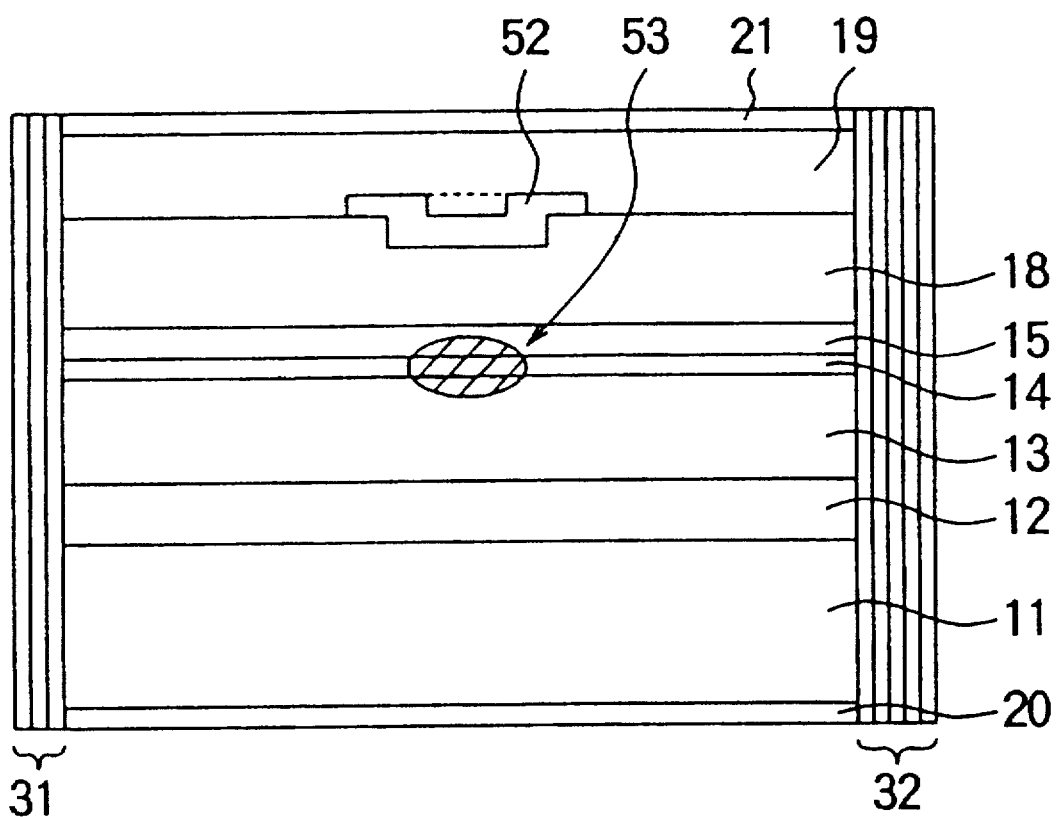
FIG. 15 is a side view of the semiconductor laser device illustrated in FIG. 14.

Referring to FIGS. 9 and 10, the description will proceed to a semiconductor laser device according to a second embodiment of this invention. The semiconductor laser device comprises similar parts designated by like reference numerals in FIG. 4 except that an n-GaInP saturable absorbing layer 41 is formed between the n-AlGaInP cladding layer 13 and an n-AlGaInP cladding layer 13' and that an n-GaInP saturable absorbing layer 42 is formed between the p-AlGaInP cladding layer 16 and a p-AlGaInP cladding layer 16'.

By the MOVPE method, the n-GaAs buffer layer 12, the n-AlGaInP cladding layer 13, the n-GaInP saturable absorbing layer 41, the n-AlGaInP cladding layer 13', the GaInP/AlGaInP multiple quantum well active layer 14, the p-AlGaInP cladding layer 15, the p-AlGaInP cladding layer 16, the p-GaInP saturable absorbing layer 42, the p-AlGaInP cladding layer 16', and the p-GaAs cap layer 17 are formed, in order, onto the n-GaAs substrate 11 in the vertical direction. For the same reason mentioned in conjunction with FIG. 5, the p-GaInP etching stopper layer and the p-GaInP thin film layer are not shown in FIG. 9.

Next, the p-AlGaInP cladding layer 16, the p-GaInP saturable absorbing layer 42, the p-AlGaInP cladding layer 16', and the p-GaAs cap layer 17 are etched by the photolithography and the etching so as to form a stripe-shaped mesa structure. By the use of the MOVPE method, a pair of the current blocking layers 18 are formed onto the cladding layer 15 at both sides of the mesa structure. The p-GaAs cap layer 19 is formed on the mesa structure and the pair of current blocking layers 18. The n-electrode 20 is formed onto an under surface of the substrate 11 while the p-electrode 21 is formed onto the cap layer 19. By the cleavage, the front and the rear facets are formed. After this, the multiple high reflectivity reflection films 31 are formed onto the front facet of the semiconductor laser device by the use of the amorphous silicon/alumina multiple films. Similarly, the multiple high reflectivity reflection films 32 are formed onto the rear facets of the semiconductor laser device by the use of the amorphous silicon/alumina multiple films. The multiple high reflectivity reflection films 31 have the reflectivity higher than 50(%) while the multiple high reflectivity reflection films 32 have the reflectivity higher than 50(%).

In the example, a saturable absorbing region 43 is formed in the saturable absorbing layer 41 under the mesa structure. A saturable absorbing region 44 is formed in the saturable absorbing layer 42. The pulsation operation of the semiconductor laser device is similar to that described in conjunction with FIGS. 4 and 5. Therefore, the semiconductor laser device can keep the pulsation operation in a high ambient temperature and can obtain a high light output power.

Referring to FIGS. 11 through 15, the description will proceed to a semiconductor laser device according to a third embodiment of this invention. The semiconductor laser device comprises similar parts designated by like reference numerals in FIG. 4 except for an SiO$_2$ insulation film 52 and a location of a saturable absorbing layer 53.

By the MOVPE method, the n-GaAs buffer layer 12, the n-AlGaInP cladding layer 13, the GaInP/AlGaInP multiple quantum well active layer 14, the p-AlGaInP cladding layer 15, the p-AlGaInP cladding layer 16, and the p-GaAs cap layer 17 are formed, in order, onto the n-GaAs substrate 11 in the vertical direction. For the same reason mentioned in conjunction with FIG. 5, the p-GaInP etching stopper layer and the p-GaInP thin film layer are not shown in FIG. 11. Next, the p-AlGaInP cladding layer 16 and the p-GaAs cap layer 17 are etched by the photolithography and the etching so as to form a stripe-shaped mesa structure. By the use of the MOVPE method, a pair of the current blocking layers 18 are formed onto the cladding layer 15 at both sides of the mesa structure.

After this, a groove 51 is formed by etching so as to orthogonally cross the cap layer 17. Namely, a part of the pair of current blocking layers 18 and a part of the cap layer 17 are removed by the etching. Next, the SiO$_2$ insulation film 52 is formed so as to cover the groove 51. Furthermore, the p-GaAs cap layer 19 is formed on the mesa structure, the SiO$_2$ insulation film 52, and the pair of current blocking layers 18. The n-electrode 20 is formed onto an under surface of the substrate 11 while the p-electrode 21 is formed onto the cap layer 19. By the cleavage, the front and the rear facets are formed. The multiple high reflectivity reflection films 31 are formed onto the front facets of the semiconductor laser device by the use of the amorphous silicon/ alumina multiple films. Similarly, the multiple high reflectivity reflection films 32 are formed onto the rear facet of the semiconductor laser device by the use of the amorphous silicon/alumina multiple films. The multiple high reflectivity reflection films 31 have the reflectivity higher than 50(%) while the multiple high reflectivity reflection films 32 have the reflectivity higher than 50(%).

In the example, the semiconductor laser device is provided with a stripe-shaped current injection structure. A part of the current injection structure is a current non-injection region. The saturable absorbing region 53 is formed in the multiple quantum well active layer 14 under the SiO$_2$ insulation film 52.

Figure 4:
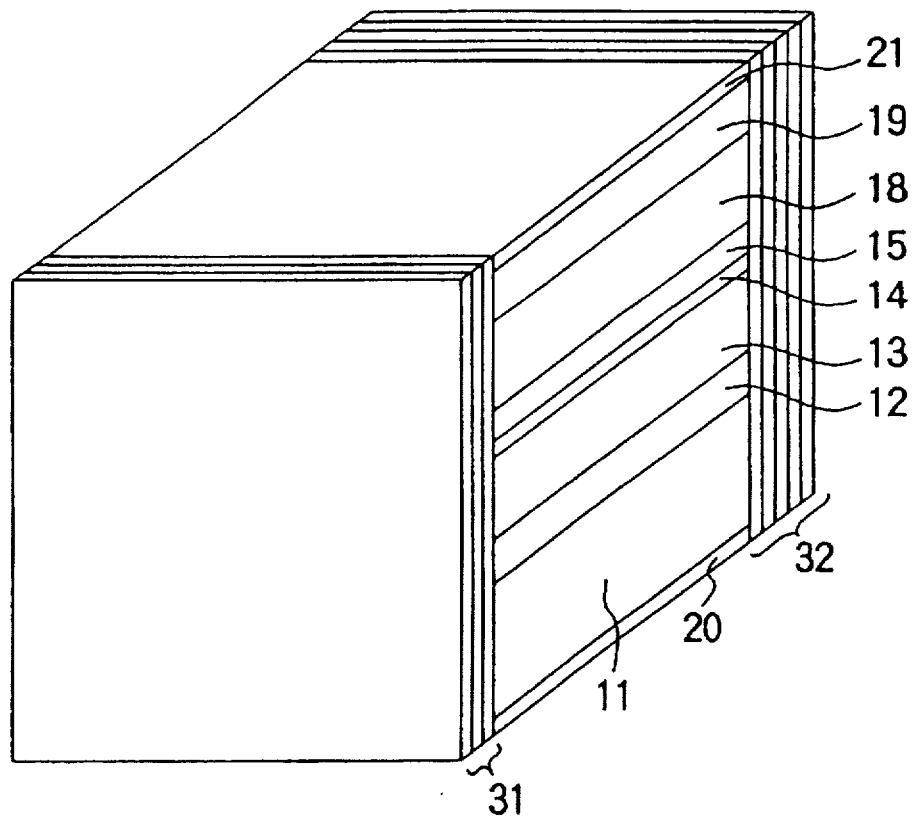
FIG. 4 shows an illustration for describing an outline of a semiconductor laser device according to a first embodiment of this invention.

The pulsation operation of the semiconductor laser device is similar to that described in conjunction with FIGS. 4 and 5. Therefore, the semiconductor laser device can keep the pulsation operation in a high ambient temperature and can obtain a high light output power by combination the spot size of a large size and the multiple high reflectivity reflection films having high reflectivities.

In addition, ion implantation may be carried out to the saturable absorbing region 53 in order to control a carrier lifetime in the saturable absorbing region 53.

While this invention has thus far been described in conjunction with a few embodiments thereof, it will readily be possible for those skilled in the art to put this invention into practice in various other manners. For example, although the semiconductor laser device is applied to the symmetrical structure with regard to the aluminium composition of the multiple quantum well active layer and the cladding layers, the semiconductor laser device may be applied to an asymmetrical structure thereof. In this case, it makes it easy to enlarge the spot size and to reduce a difference of refraction index between an equivalent refraction index at the mesa structure and the equivalent refraction index at both sides of the mesa structure.

What is claimed is:

1. A semiconductor laser device comprising a plurality of semiconductor layers laminated in a vertical direction on a substrate to form a laser resonator, said laser resonator comprising a saturable absorbing region formed therein, a first facet defining a laser emitting surface, and a second facet opposite to said first facet;

a spot size of a light waveguide profile in said vertical direction being greater than 0.4 µm;

said laser resonator further comprising first and second reflecting films which are coated on said first and said second facets to provide a reflectivity greater than 50(%).

2. A semiconductor laser device as claimed in claim 1, wherein said plurality of semiconductor layers comprising an active layer and a cladding layer formed on said active layer, a mesa structure being formed onto said cladding layer, said plurality of semiconductor layers further comprising a pair of blocking layer formed at both sides of said mesa structure for confining a current, said saturable absorbing region being formed to said active layer at both sides of said mesa structure.

3. A semiconductor laser device as claimed in claim 1, wherein said plurality of semiconductor layers comprising an active layer and cladding layers formed over said active layer and under said active layer, said saturable absorbing region being formed at least one of said cladding layers.

4. A semiconductor laser device as claimed in claim 1, wherein said laser resonator is provided with a stripe-shaped current injection structure, a part of said stripe-shaped current injection structure being a current non-injection region, said saturable absorbing region being formed at said current non-injection region.

5. A semiconductor laser device as claimed in claim 4, wherein ion implantation is carried out in said saturable absorbing region.

* * * * *